US011276797B2

(12) United States Patent
Tsai et al.

(10) Patent No.: US 11,276,797 B2
(45) Date of Patent: Mar. 15, 2022

(54) OPTICAL DEVICE AND METHOD OF MANUFACTURING THE SAME

(71) Applicant: Advanced Semiconductor Engineering, Inc., Kaohsiung (TW)

(72) Inventors: Hsiang-Cheng Tsai, Kaohsiung (TW); Lu-Ming Lai, Kaohsiung (TW); Hsun-Wei Chan, Kaohsiung (TW); Ying-Chung Chen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 96 days.

(21) Appl. No.: 16/384,847

(22) Filed: Apr. 15, 2019

(65) Prior Publication Data
US 2020/0328322 A1    Oct. 15, 2020

(51) Int. Cl.
*H01L 31/12*   (2006.01)
*H01L 31/0203*   (2014.01)
*H01L 31/0232*   (2014.01)

(52) U.S. Cl.
CPC ......... *H01L 31/12* (2013.01); *H01L 31/0203* (2013.01); *H01L 31/02325* (2013.01)

(58) Field of Classification Search
CPC ................. H01L 31/12; H01L 31/0203; H01L 31/02325
See application file for complete search history.

(56) References Cited

U.S. PATENT DOCUMENTS

| | | | |
|---|---|---|---|
| 2009/0268466 A1* | 10/2009 | Allegri | F21V 5/048 362/268 |
| 2016/0054175 A1 | 2/2016 | Jia et al. | |
| 2016/0163750 A1 | 6/2016 | Umali et al. | |
| 2016/0352071 A1* | 12/2016 | Hogan | H01S 5/1835 |
| 2018/0017741 A1* | 1/2018 | Ho | G02B 6/0091 |
| 2018/0195901 A1* | 7/2018 | Carpenter | G01J 9/0246 |
| 2020/0291529 A1* | 9/2020 | Thayer | C23C 28/345 |

\* cited by examiner

*Primary Examiner* — Mohammad M Choudhry
(74) *Attorney, Agent, or Firm* — Foley & Lardner LLP

(57) ABSTRACT

An optical module and a method of manufacturing an optical module are provided. The optical module includes a carrier, an electronic component, a lid, a diffuser and a bonding layer. The electronic component is disposed on the carrier. The lid is disposed on the carrier. The lid has a first cavity to accommodate the electronic component. The lid defines a first aperture over the first cavity. The diffuser is disposed within the first aperture. The bonding layer is disposed between the diffuser and a sidewall of the first aperture.

14 Claims, 10 Drawing Sheets

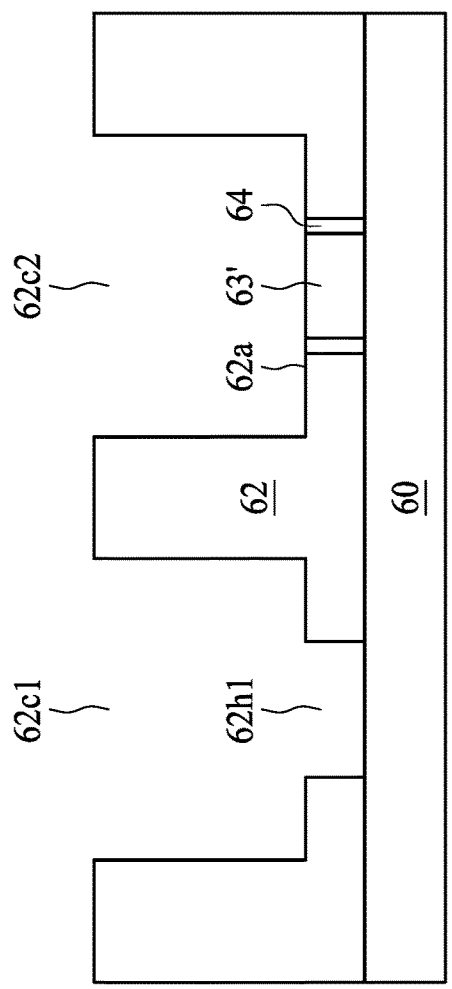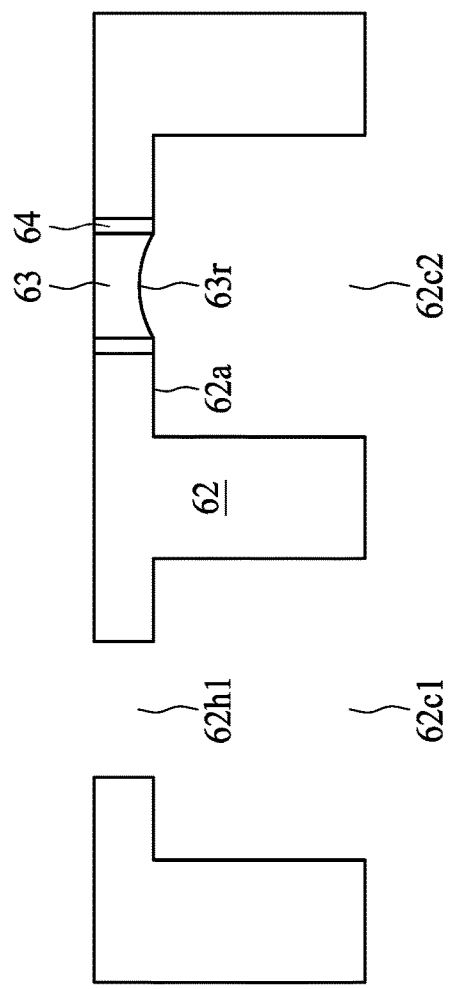

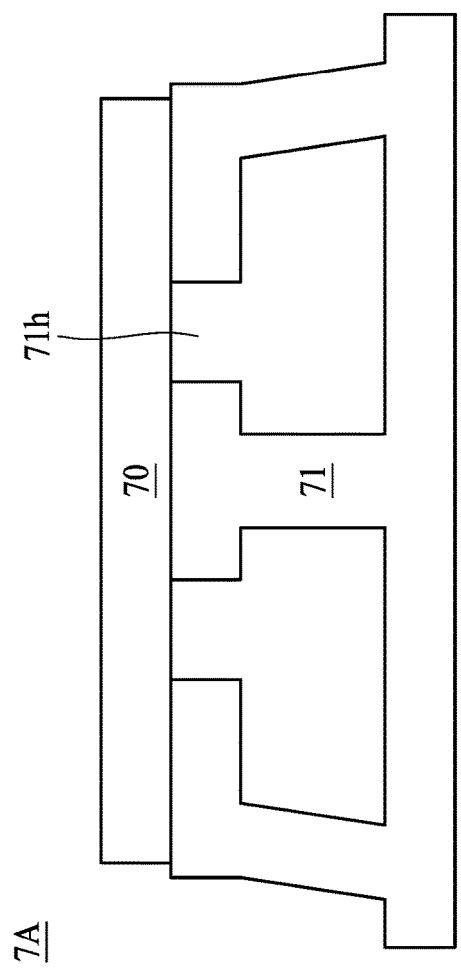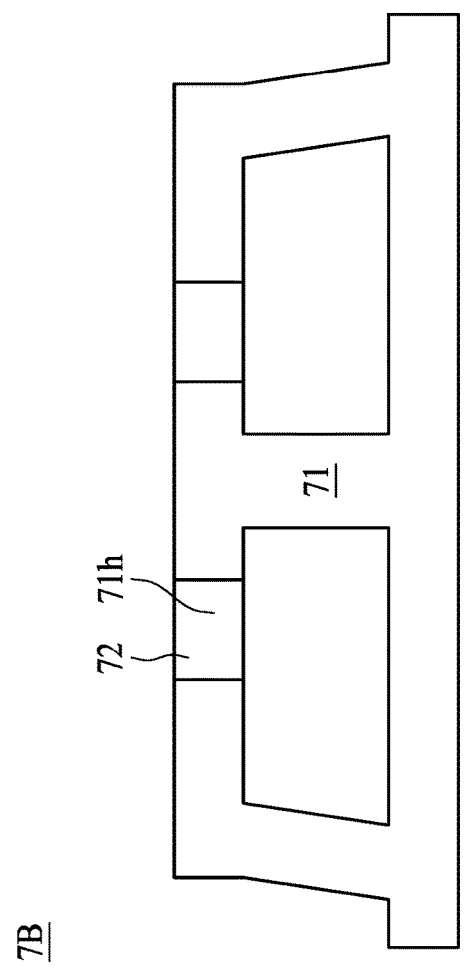

OPTICAL DEVICE AND METHOD OF MANUFACTURING THE SAME

BACKGROUND

1. Technical Field

The present disclosure relates to an optical device, and more particularly to an optical device including a light detector and a diffuser.

2. Description of the Related Art

Optical modules (e.g., Ambient light sensors (ALS)) are used in variety of electronic devices such as cell phones, tablets, laptops/notebooks and the like. To improve performance of a light detector of an optical module, a relatively greater detection angle and relatively uniform light are desired. However, such structure may inevitably increase the size of the optical module, which will hinder the miniaturization of the electronic device.

SUMMARY

In accordance with an aspect of the present disclosure, an optical module includes a carrier, an electronic component, a lid, a diffuser and a bonding layer. The electronic component is disposed on the carrier. The lid is disposed on the carrier. The lid has a first cavity to accommodate the electronic component. The lid defines a first aperture over the first cavity. The diffuser is disposed within the first aperture. The bonding layer is disposed between the diffuser and a sidewall of the first aperture.

In accordance another aspect of the present disclosure, an optical module includes a carrier, an electronic component, a lid, a diffuser and a bonding layer. The electronic component is disposed on the carrier. The lid is disposed on the carrier. The lid defining a first aperture over the electronic component. The diffuser is disposed within the first aperture. The bonding layer is disposed between the diffuser and a sidewall of the first aperture. The bonding layer includes a material crystalized in BCC lattice.

In accordance another aspect of the present disclosure, an optical module includes a carrier, an electronic component, a lid and a diffuser. The electronic component is disposed on the carrier. The lid is disposed on the carrier. The lid defines a first aperture over the electronic component. The diffuser is disposed within the first aperture. The diffuser has an inwardly-concave surface.

In accordance another aspect of the present disclosure, a method of manufacturing an optical module includes (a) providing a carrier, (b) placing a lid on the carrier, the lid defining an aperture to expose the carrier and a cavity over the aperture, (c) forming a bonding layer on sidewall of the aperture and the cavity of the lid, (d) dispensing a diffuser gel into the aperture, and (e) removing the carrier from the lid.

BRIEF DESCRIPTION OF THE DRAWINGS

FIG. 6A, FIG. 6B, FIG. 6C and FIG. 6D illustrate a method for manufacturing an optical device in accordance with some embodiments of the present disclosure;

FIG. 7A illustrates a cross-sectional view of an air type package in accordance with some embodiments of the present disclosure; and FIG. 7B illustrates a cross-sectional view of an air type package in accordance with some embodiments of the present disclosure.

Figure 1:
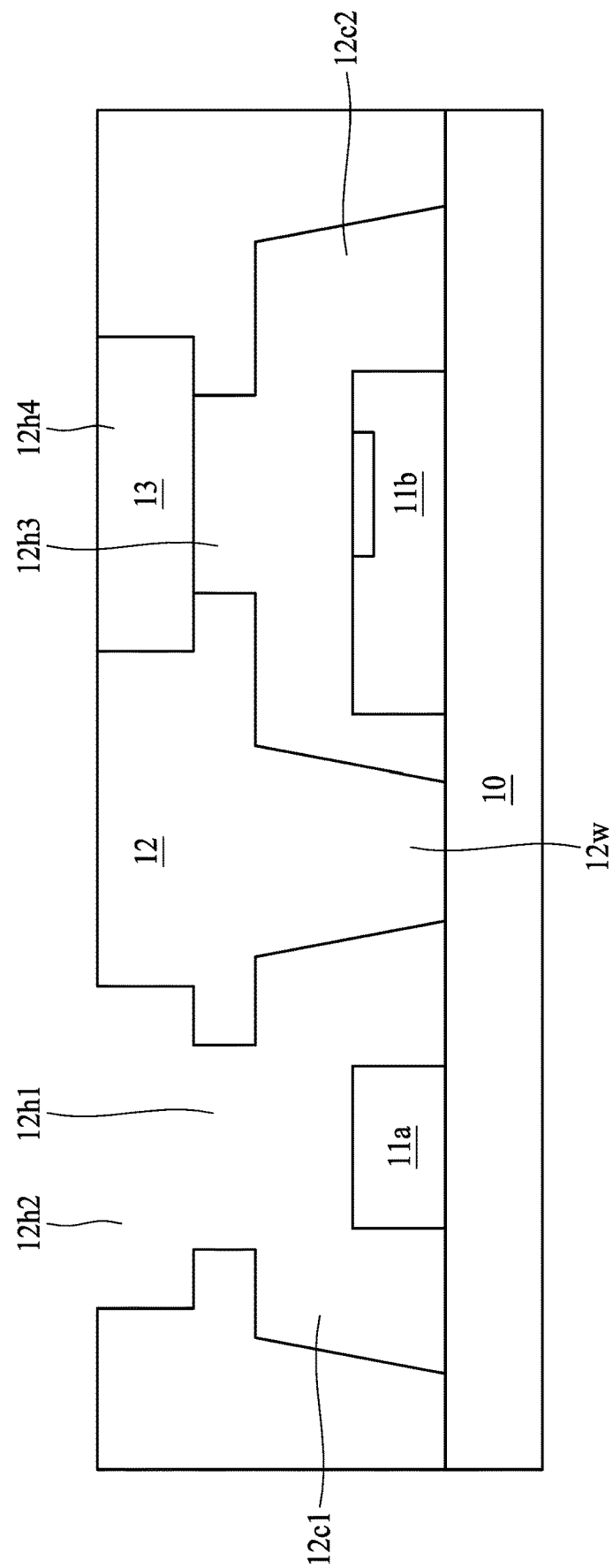
FIG. 1 illustrates a cross-sectional view of an optical device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1 illustrates a cross-sectional view of some embodiments of an optical device 1 in accordance with a first aspect of the present disclosure. The optical device 1 includes a carrier 10, electronic components 11a, 11b, a lid 12 and a diffuser sheet 13.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as a plurality of conductive traces or a through via. In some embodiments, the carrier 10 includes a ceramic material or a metal plate. In some embodiments, the carrier 10 may include a substrate, such as an organic substrate or a leadframe. In some embodiments, the carrier 10 may include a two-layer substrate which includes a core layer and a conductive material and/or structure disposed on an upper surface and a bottom surface of the carrier 10. The conductive material and/or structure may include a plurality of traces, pads or vias.

The electronic component 11a is disposed on the carrier 10. The electronic component 11a may include an emitting die or other optical die. For example, the electronic component 11a may include a light-emitting diode (LED), a laser diode, or another device that may include one or more semiconductor layers. The semiconductor layers may include silicon, silicon carbide, gallium nitride, or any other semiconductor materials. The electronic component 11a can be connected to the carrier 10 by way of flip-chip or wire-bond techniques, for example. In some embodiments, the electronic component 11a includes an LED die bonded on the carrier 10 via a die bonding material. The LED die includes at least one wire-bonding pad. The LED die is electrically connected to the carrier 10 by a conductive wire, one end of which is bonded to the wire-bonding pad of the LED die and another end of which is bonded to a wire-bonding pad of the carrier 10. The electronic component 11a has an active region (or light emitting area) facing away from the carrier 10.

The electronic component 11b is disposed on the carrier 10 and is physically separated from the electronic component 11a. In some embodiments, the electronic component 11b may include a light detector which is, for example, a PIN diode (a diode including a p-type semiconductor region, an intrinsic semiconductor region, and an n-type semiconductor region) or a photo-diode or a photo-transistor. In some embodiments, the second electronic component 11b includes ambient light sensors (ALS). The electronic component 11b can be connected to the carrier 10, for example, by way of flip-chip or wire-bond techniques. The electronic component 11b has an active region (or light detecting area) facing away from the carrier 10.

The lid (or housing) 12 is disposed on the carrier 10. The lid 12 defines a cavity 12c1 to accommodate the electronic component 11a and a cavity 12c2 to accommodate the electronic component 11b. The lid 12 has a wall structure 12w disposed between the electronic component 11a and the electronic component 11b to separate the electronic component 11a from the electronic component 11b. The lid 12 includes an opaque material to prevent undesired light emitted by the electronic component 11a from being directly transmitted to the electronic component 11b.

The lid 12 defines apertures (or openings) 12h1 and 12h2 over the cavity 12c1. In some embodiments, the apertures 12h1 and 12h2 expose at least a portion (e.g., the light emitting area) of the electronic component 11a. The aperture 12h2 is above the aperture 12h1 (e.g. the aperture 12h1 is defined by a portion of the lid 12 that constitutes a bottom of the aperture 12h2). In some embodiments, a width of the aperture 12h2 is greater than a width of the aperture 12h1 (e.g. is about 10% greater than, about 20% greater than, about 30% greater than, or more than about 30% greater than).

The lid 12 further defines apertures (or openings) 12h3 and 12h4 over the cavity 12c2. In some embodiments, the apertures 12h3 and 12h4 expose at least a portion (e.g., the light detecting area) of the electronic component 11b. The aperture 12h4 is above the aperture 12h3 (e.g. the aperture 12h3 is defined by a portion of the lid 12 that constitutes a bottom of the aperture 12h4) configured to accommodate the diffuser sheet 13. In some embodiments, a width of the aperture 12h4 is greater than a width of the aperture 12h3 (e.g. is about 10% greater than, about 20% greater than, about 30% greater than, or more than about 30% greater than).

The diffuser sheet 13 is disposed within the aperture 12h4. The diffuser sheet 13 is used to break up and evenly distribute light radiated toward the electronic component 11b, which would enhance the uniformity of the light received by the electronic component 11b. The lid 12 may be designed to have a relatively great thickness to accommodate a relatively thick diffuser sheet 13 which may improve light uniformity. Moreover, in order to support the diffuser sheet 13 in the aperture 12h4, a step structure which defines the aperture 12h3 is included, and such step structure would also increase the thickness of the lid 12. Furthermore, it is challenging to control the tolerance of the thickness (e.g., about +/−30 micrometer) of the diffuser sheet 13.

Figure 2A:
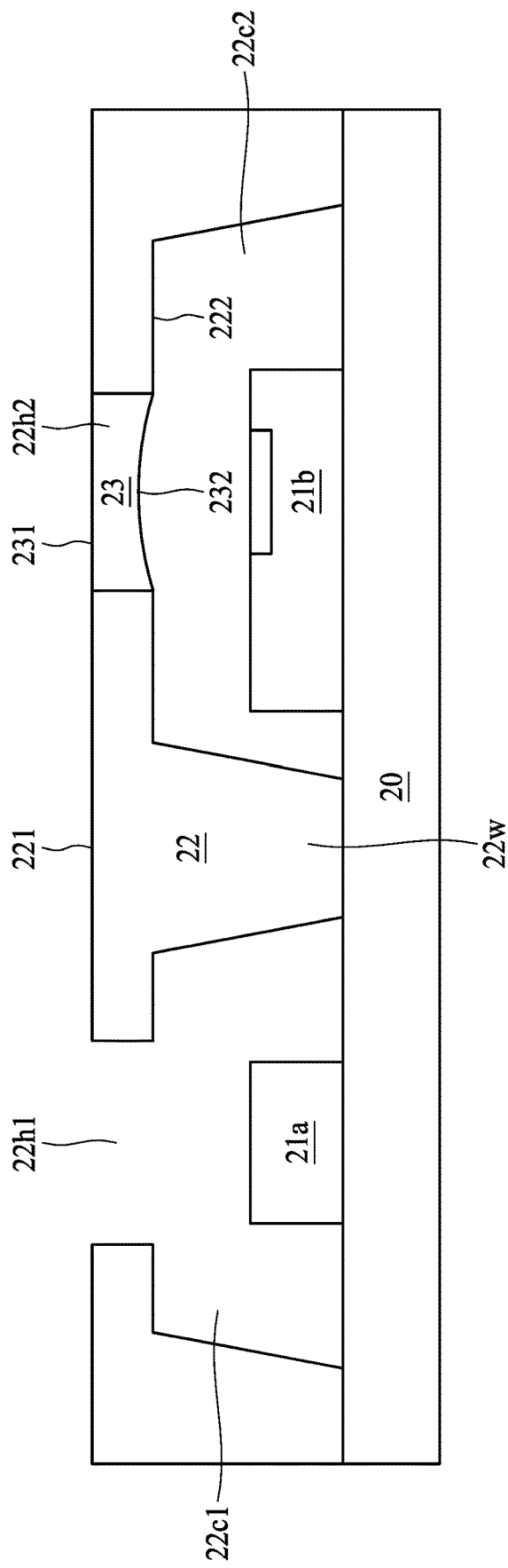
FIG. 2A illustrates a cross-sectional view of an optical device in accordance with some embodiments of the present disclosure.

FIG. 2A illustrates a cross-sectional view of an optical device 2A in accordance with some embodiments of the present disclosure. The optical device 2A includes a carrier 20, electronic components 21a, 21b, a lid 22 and a diffuser film 23. Each of the carrier 20 and the electronic components 21a, 21b may be respectively similar to or the same as the carrier 10 and the electronic components 11a, 11b described and illustrated with reference to FIG. 1. Alternatively, each of the carrier 20 and the electronic components 21a, 21b may be different from the carrier 10 and the electronic components 11a, 11b shown in FIG. 1 depending on different design specifications.

The lid (or housing) 22 is disposed on the carrier 20. The lid 22 defines a cavity 22c1 to accommodate the electronic component 21a and a cavity 22c2 to accommodate the electronic component 21b. The lid 22 has a wall structure 22w disposed between the electronic component 21a and the electronic component 21b to separate the electronic component 21a from the electronic component 21b. The lid 22 includes an opaque material to prevent undesired light emitted by the electronic component 21a from being directly transmitted to the electronic component 21b.

The lid 22 defines an aperture (or opening) 22h1 over the cavity 22c1. In some embodiments, the aperture 22h1 expose at least a portion (e.g., the light emitting area) of the electronic component 21a. The lid 22 further defines an aperture (or opening) 22h2 over the cavity 22c2. In some embodiments, the aperture 22h2 expose at least a portion (e.g., the light detecting area) of the electronic component 21b.

The diffuser film 23 is disposed within the aperture 22h2. The diffuser film 23 is used to break up and evenly distribute light radiated toward the electronic component 21b, which would enhance the uniformity of the light received by the electronic component 21b. The diffuser film 23 includes a surface 231 facing away from the carrier 20 and a surface 232 facing the carrier 20. The surface 231 of the diffuser film 23 is substantially coplanar with a surface 221 of the lid 22. The surface 232 of the diffuser film 23 is recessed from a surface 222 of the lid 22. For example, the surface 232 of the diffuser film 23 is an inwardly-concave surface. For example, the diffuser film 23 can act as a concave lens. In some embodiments, a thickness of the diffuser film 23 is equal to or less than a depth of the aperture 22h2 (or a thickness of the lid 22). For example, the thickness of a portion of the diffuser film 23 adjacent to a sidewall of the aperture 22h2 is substantially equal to the depth of the aperture 22h2. For example, the thickness of the a portion of the diffuser film 23 far away from the sidewall of the aperture 22h2 is less than the depth of the aperture 22h2.

In some embodiments, the diffuser film 23 is formed by dispensing diffuser gel within the aperture 22h2 (detailed processes will be described below). In some embodiments, the diffuser film 23 may include a ground glass diffuser, a fluoropolymer (e.g. Teflon) diffuser, a holographic diffuser, an opal glass diffuser, and a greyed glass diffuser. In some embodiments, the diffuser film 23 may be formed of GaN or fused silica. The diffuser film 23 may be formed by a dispensing technique, e.g. dispensing diffuser gel within the aperture 22h2. The diffuser gel, which is adhered to the sidewall that defines the aperture 22h2, is then cured/hardened to form the diffuser film 23. Accordingly, a support structure (e.g. the step structure as shown in FIG. 1) can be omitted, and the thickness of the lid 22 is reduced. Moreover, since the thickness and the shape of the diffuser film 23 are substantially conformal to the aperture 22h2, the tolerance of the thickness of the diffuser film 23 can be mitigated or reduced.

Figure 2B:
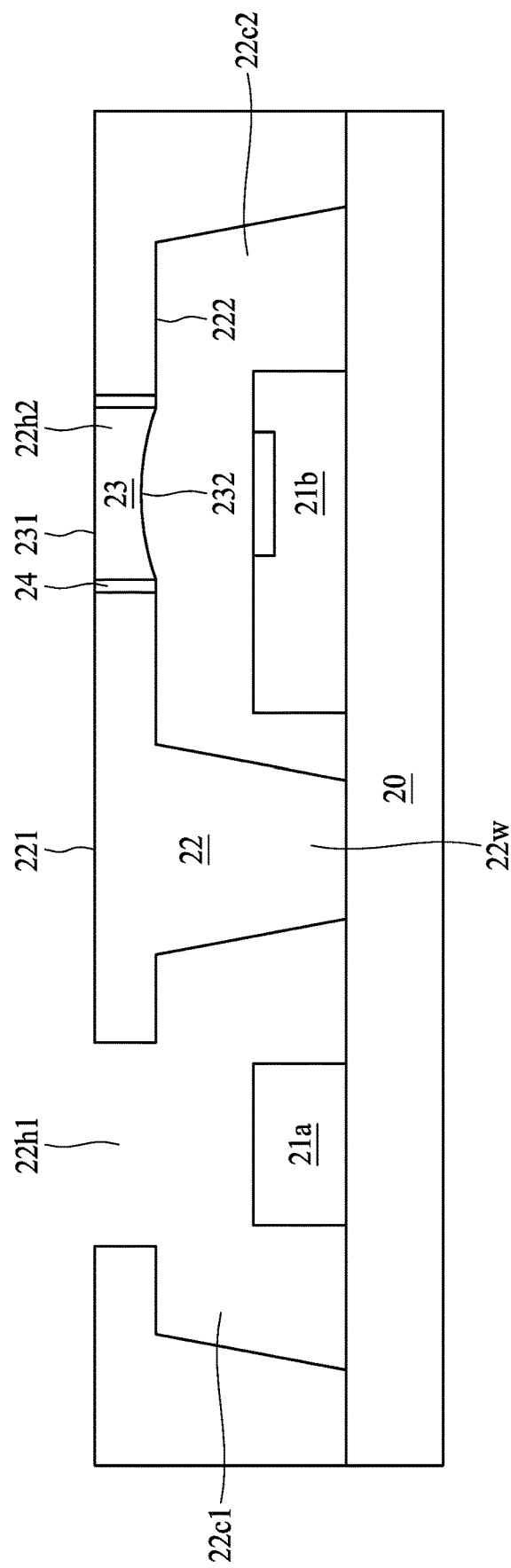
FIG. 2B illustrates a cross-sectional view of an optical device in accordance with some embodiments of the present disclosure.

FIG. 2B illustrates a cross-sectional view of an optical device 2B in accordance with some embodiments of the present disclosure. The optical device 2B is similar to the optical device 2A except that the optical device 2B further includes a bonding layer 24. The bonding layer 24 is disposed between the diffuser film 23 and the sidewall of the aperture 22h2. The bonding layer 24 is in contact with the diffuser film 23 and the sidewall of the aperture 22h2. In some embodiments, a thickness of the bonding layer is in a range from 100 nanometer (nm) to 200 nm.

In some embodiments, the bonding layer 24 has a body-centered cubic (BCC) crystal structure. For example, the bonding layer 24 includes a material crystalized in BCC lattice. In some embodiments, the bonding layer may be formed of or include metal or metal oxide. Since the bonding layer 24 includes a material with the BCC structure, a gap or distance between two adjacent atoms is relatively larger than a material with a face-centered cubic (FCC) or primitive cubic structure. In other words, the bonding layer 24 may has a loose structure, and the surface fluctuation (or roughness) defined by the stacked atoms of the bonding layer 24 is relatively large. This will increase the contact area between the bonding layer 24 and the diffuser film 23, and the connection capability between the bonding layer 24 and the diffuser film 23 can be enhanced, which would in turn avoid the delamination between the lid 22 and the diffuser film 23.

Figure 3:
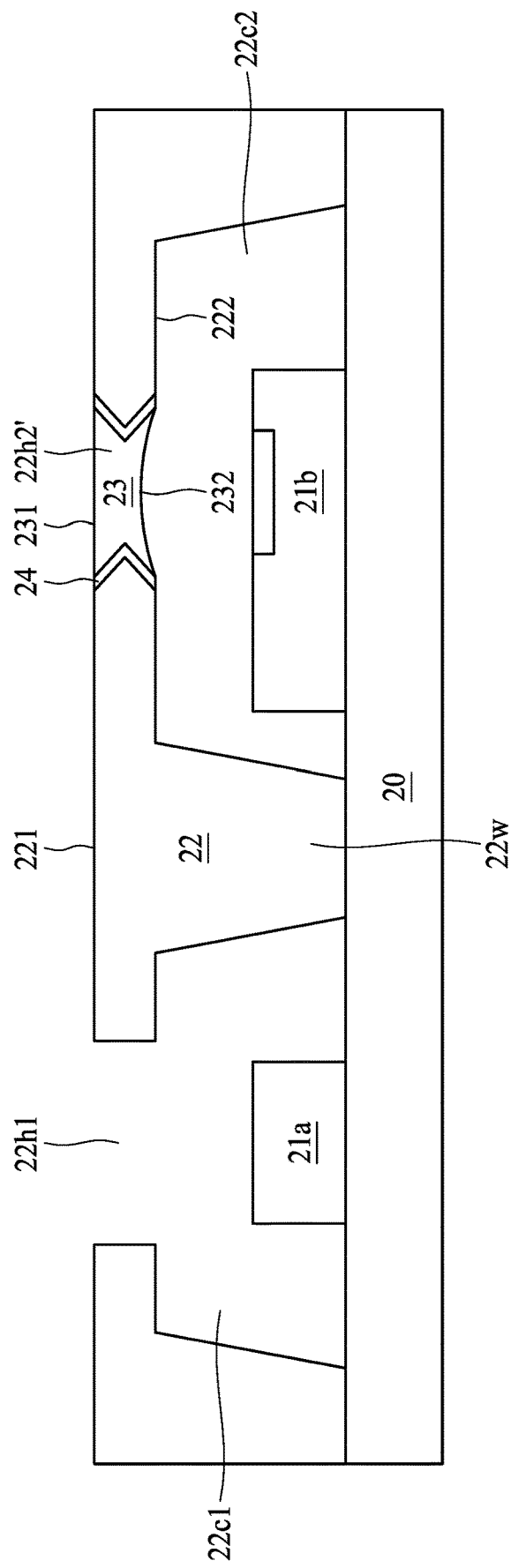
FIG. 3 illustrates a cross-sectional view of an optical device in accordance with some embodiments of the present disclosure.

FIG. 3 illustrates a cross-sectional view of an optical device 3 in accordance with some embodiments of the present disclosure. The optical device 3 is similar to the optical device 2B except that the aperture 22h2' in FIG. 3 is different from the aperture 22h2 in FIG. 2B in shape.

The aperture 22h2' has a first portion tapered from the surface 221 of the lid 22 toward the surface 222 of the lid 22 and a second portion tapered from the surface 222 of the lid 22 toward the surface 221 of the lid 22. The first portion of the aperture 22h2' and the second portion of the aperture 22h2' are connected to define the aperture 22h2'. For example, the aperture 22h2' has a shape of an hourglass or a funnel.

The diffuser film 23 is disposed within the aperture 22h2' and substantially conformal to the shape of the aperture 22h2'. The diffuser film 23 is used to break up and evenly distribute light radiated toward the electronic component 21b, which would enhance the uniformity of the light received by the electronic component 21b. The diffuser film 23 includes a surface 231 facing away from the carrier 20 and a surface 232 facing the carrier 20. The surface 231 of the diffuser film 23 is substantially coplanar with a surface 221 of the lid 22. The surface 232 of the diffuser film 23 is recessed from a surface 222 of the lid. For example, the surface 232 of the diffuser film 23 is an inwardly-concave surface. For example, the diffuser film 23 can act as a concave lens. In some embodiments, a thickness of the diffuser film 23 is equal to or less than a depth of the aperture 22h2' (or a thickness of the lid 22). For example, the thickness of a portion of the diffuser film 23 adjacent to a sidewall of the aperture 22h2' is substantially equal to the depth of the aperture 22h2'. For example, the thickness of the a portion of the diffuser far away from the sidewall of the aperture 22h2' is less than the depth of the aperture 22h2'.

Figure 4A:
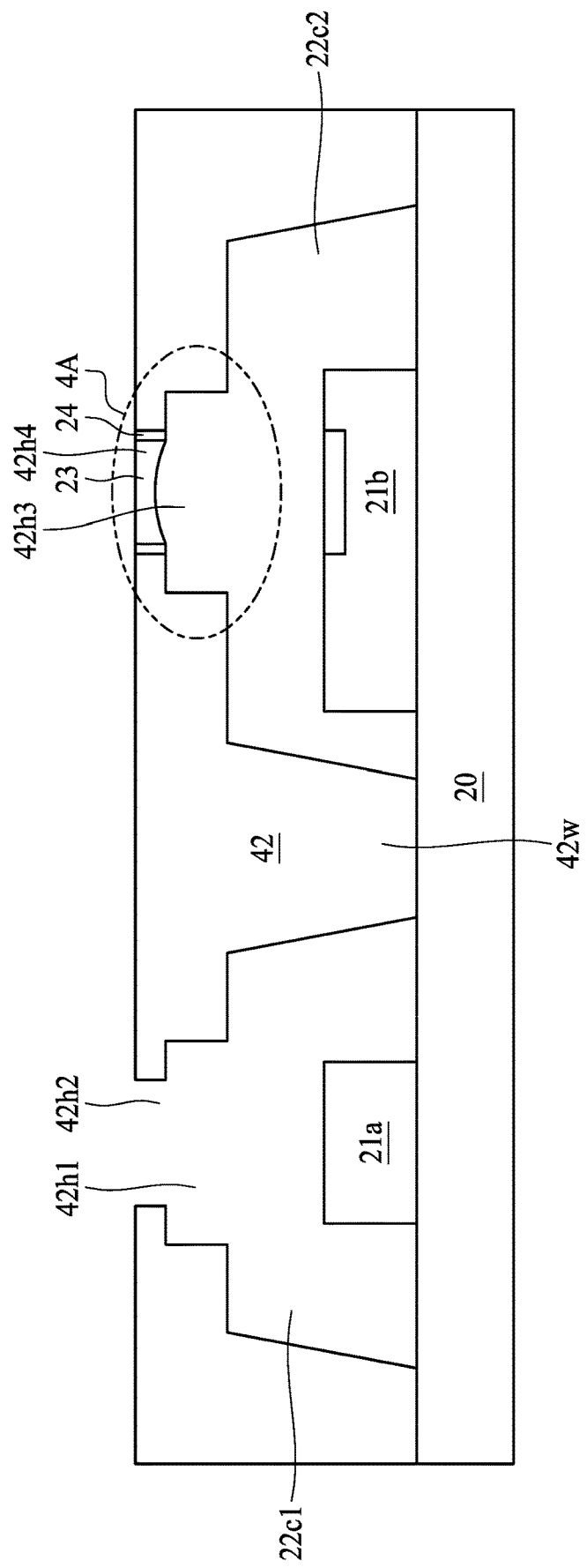
FIG. 4A illustrates a cross-sectional view of an optical device in accordance with some embodiments of the present disclosure.

FIG. 4A illustrates a cross-sectional view of an optical device 4 in accordance with some embodiments of the present disclosure. The optical device shown in FIG. 4A is similar to that shown in FIG. 2B, and the differences therebetween will be descried below.

The lid 42 defines apertures (or openings) 42h1 and 42h2 over the cavity 22c1. In some embodiments, the apertures 42h1 and 42h2 expose at least a portion (e.g., the light emitting area) of the electronic component 21a. The aperture 42h2 is above the aperture 42h1 and connected to the aperture 42h1. In some embodiments, a width of the aperture 42h1 is greater than a width of the aperture 42h2 (e.g. is about 10% greater than, about 20% greater than, about 30% greater than, or more than about 30% greater than).

The lid 42 further defines apertures (or openings) 42h3 and 42h4 over the cavity 22c2. In some embodiments, the apertures 42h3 and 42h4 expose at least a portion (e.g., the light detecting area) of the electronic component 21b. The aperture 42h4 is above the aperture 42h3. In some embodiments, a width of the aperture 42h3 is greater than a width of the aperture 42h4 (e.g. is about 10% greater than, about 20% greater than, about 30% greater than, or more than about 30% greater than).

Figure 4B:
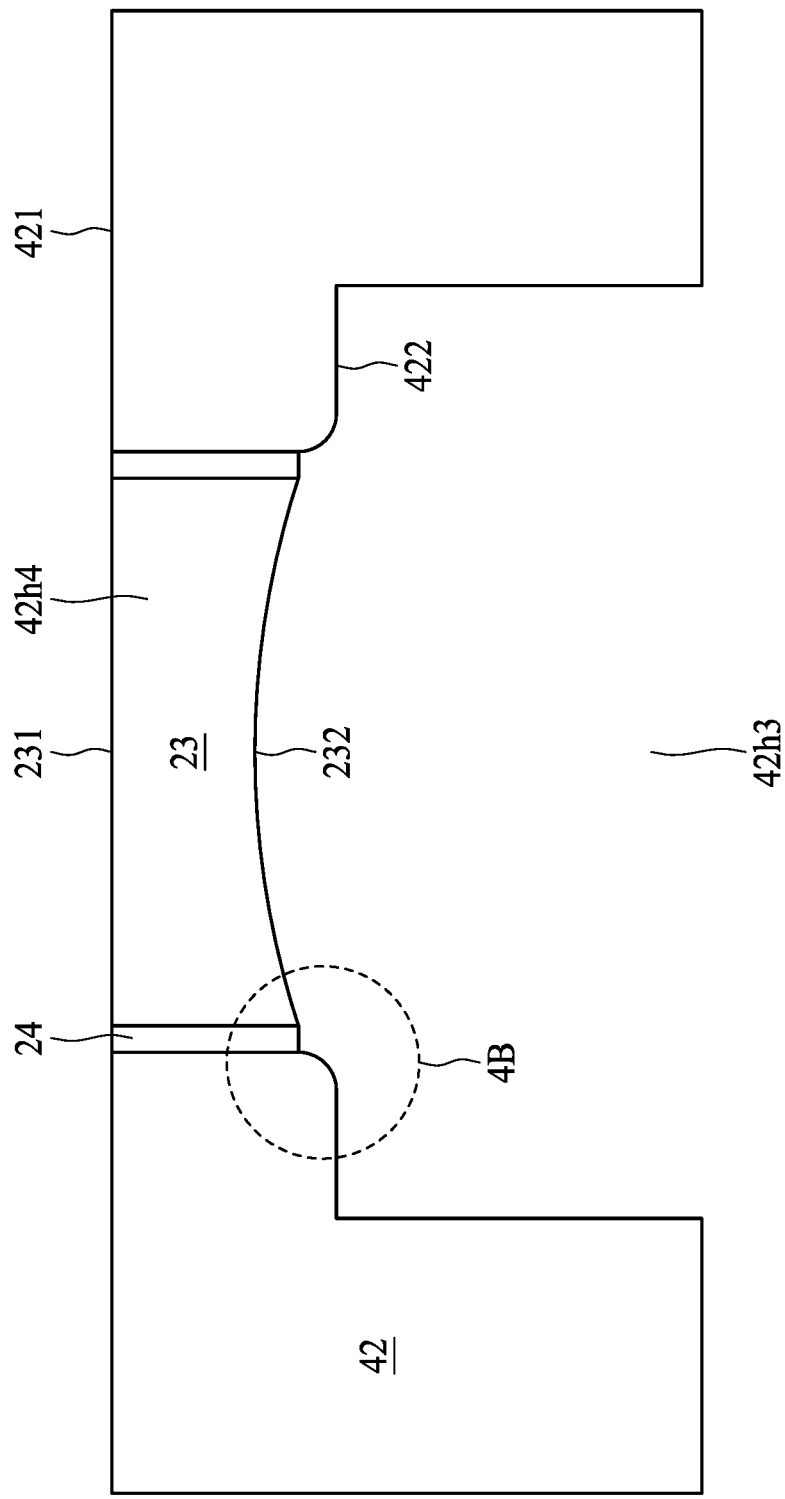
FIG. 4B illustrates a enlarged view of a portion of the optical device in FIG. 4A in accordance with some embodiments of the present disclosure.

The diffuser film 23 is disposed within the aperture 42h4. The diffuser film 23 is used to break up and evenly distribute light radiated toward the electronic component 21b, which would enhance the uniformity of the light received by the electronic component 21b. As shown in FIG. 4B, which illustrated an enlarged view of a portion of the optical device 4 in FIG. 4A circled by a dotted-line circle 4A, the diffuser film 23 includes a surface 231 facing away from the carrier 20 and a surface 232 facing the carrier 20. The surface 231 of the diffuser film 23 is substantially coplanar with a surface 421 of the lid 42. The surface 232 of the diffuser film 23 is recessed from a surface 422 of the lid 42. For example, the surface 232 of the diffuser film 23 is an inwardly-concave surface. For example, the diffuser film 23 can act as a concave lens. In some embodiments, a thickness of the diffuser film 23 is equal to or less than a depth of the aperture 42h4. For example, the thickness of a portion of the diffuser film 23 adjacent to a sidewall of the aperture 42h4 is substantially equal to the depth of the aperture 42h4. For example, the thickness of the a portion of the diffuser film 23 far away from the sidewall of the aperture 42h4 is less than the depth of the aperture 42h4.

As shown in FIG. 4B, the apertures 42h3 and 42h4 may define a ladder-like structure. In some embodiments, the ladder-like structure has a curved corner (circled by a dotted-line circle 4B). The diffuser film 23 is conformal to the shape of the aperture 42h4 of the lid 42, and the ladder-like structure of the lid 42 is used to prevent the diffuser gel from overflowing or bleeding during the manufacturing process.

Figure 5B:
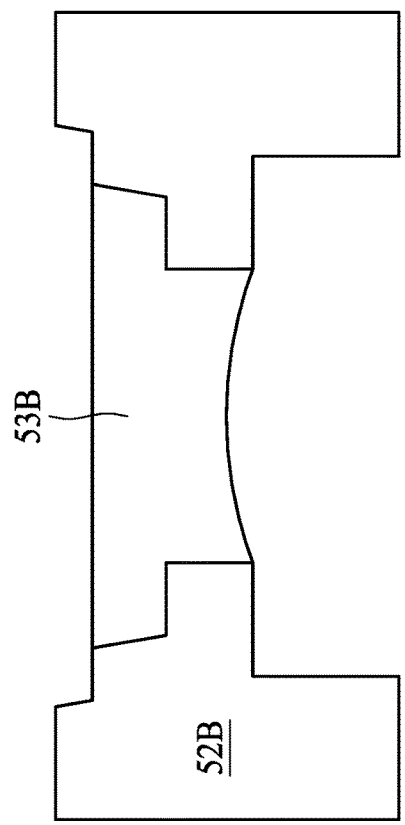
FIG. 5B illustrates a cross-sectional view of a lid in accordance with some embodiments of the present disclosure.
Figure 5A:
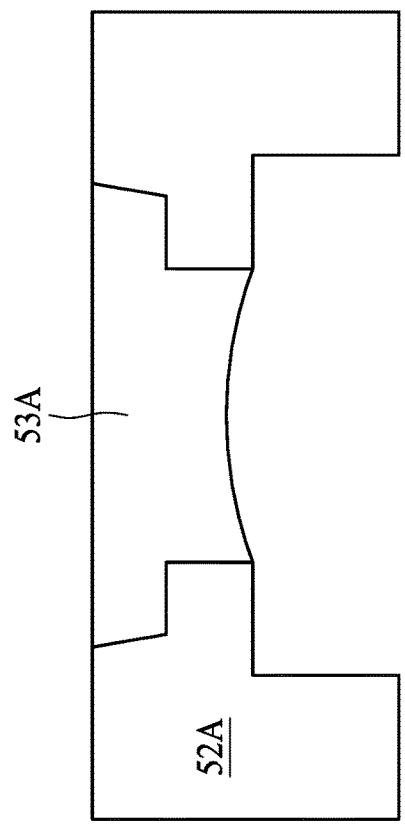
FIG. 5A illustrates a cross-sectional view of a lid in accordance with some embodiments of the present disclosure.

FIGS. 5A and 5B illustrate cross-sectional views of lids 52A, 52B and diffuser films 53A, 53B in accordance with some embodiments of the present disclosure. As shown in FIG. 5A, the diffuser films 53A can be disposed with both apertures of the lids 52A. As shown in FIG. 5B, the lid 53B may include three apertures to define two ladder-like structures. In some embodiments, the lid may include any number of ladder-like structures depending on different design specifications.

FIGS. 6A, 6B, 6C and 6D are cross-sectional views of an optical device fabricated at various stages, in accordance with some embodiments of the present disclosure. Various figures have been simplified for a better understanding of the aspects of the present disclosure.

Figure 6A:
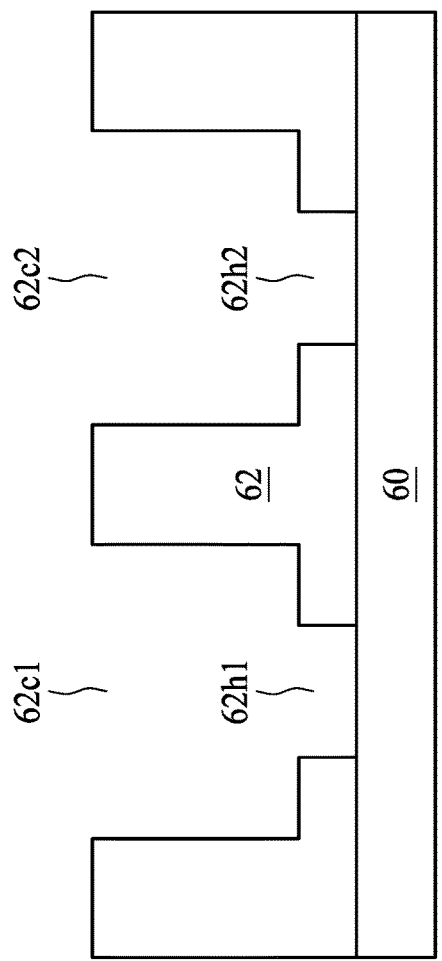

Referring to FIG. 6A, a carrier 60 is provided and a lid 62 is placed on the carrier 60. In some embodiments, the lid 62 is attached to the carrier 60 through an adhesive layer, such as a tape or a glue. The lid 62 includes apertures 62h1 and 62h2 to expose a portion of the carrier 60. The lid 62 further includes cavities 62c1 and 62c2 over the apertures 62h1 and 62h2 to accommodate electronic components. For example, the cavity 62c1 may be used to accommodate a light emitter and the cavity 62c2 may be used to accommodate a light detector. In some embodiments, a width of the cavities 62c1 and 62c2 is greater than a width of the apertures 62h1 and 62h2.

Figure 6B:
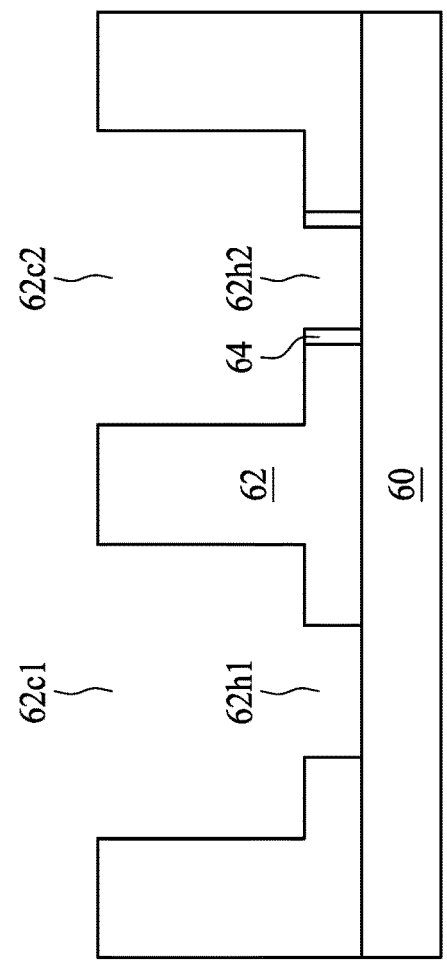

Referring to FIG. 6B, a bonding layer 64 is formed on a sidewall of the aperture 62h2 by, for example, sputtering or any other suitable processes. In other embodiments, the bonding layer 64 may be also formed on a sidewall of the cavity 62c2 depending on different design specifications. In some embodiments, the bonding layer 64 has a BCC crystal structure. For example, the bonding layer 64 includes a material crystalized in BCC lattice. In some embodiments, the bonding layer may be formed of or include metal or metal oxide. Since the bonding layer 64 includes a material with the BCC structure, a gap or distance between two adjacent atoms is relatively larger than a material with a FCC or primitive cubic structure. In other words, the bonding layer 64 may has a loose structure, and the surface fluctuation (or roughness) defined by the stacked atoms of the bonding layer 64 is relatively large. This will increase the contact area between the bonding layer 64 and the diffuser film 63, and the connection capability between the bonding layer 64 and the diffuser film 63 can be enhanced, which would in turn avoid the delamination between the lid 62 and the diffuser film 63.

Referring to FIG. 6C, a diffuser gel 63' is dispensed into the aperture 62h2. In some embodiments, the diffuser gel 63' may include GaN or fused silica. In some embodiments, the amount of the diffuser gel 63' is controlled to avoid bleeding or flowing out from the aperture 62h2. For example, the amount of the diffuser gel 63' is controlled to avoid the diffuser gel 63' from flowing onto a bottom surface 62a of the cavity 62c2. For example, the diffuser gel 63' is substantially lower than or coplanar with the bottom surface 62a of the cavity 62c2.

Referring to FIG. 6D, the diffuser gel 63' is then cured (heated or hardened) to be attached or bonded to the bonding layer 64 to form the diffuser film 63. In some embodiments, the diffuser gel 63' is cured by, for example but is not limited to, an oven or other suitable equipment to form the diffuser film 63. After the curing operation, the diffuser film 63 has a recessed surface (or inwardly-concave surface) 63r.

Still referring to FIG. 6D, the carrier 60 and the adhesive (if any) are removed from the lid 62 and the diffuser film 63. The lid 62 with the diffuser film 63 may be placed on a carrier with a light emitter and a light detector thereon to form the optical device as shown in FIG. 2B.

In some embodiments, the operations shown in FIGS. 6A, 6B, 6C and 6D are applicable to forming an air type package with a lens. For example, as shown in FIG. 7A, to form an air type package 7A in the comparative approach, a glass 70 is placed on a lid 71 having apertures 71h and covers apertures 71h of the lid 71 to function as a lens. However, placing the glass 70 on the lid 71 would increase the thickness of the air type package 7A. As shown in FIG. 7B, the lens 72 is formed within the aperture 71h of the lid 71 by dispensing clear epoxy into the aperture 71h, which would reduce the thickness of the air type package 7B.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 μm, within 30 μm, within 20 μm, within 10 μm, or within 1 μm of lying along the same plane. Two components can be deemed to be "substantially aligned" if, for example, the two components overlap or are within 200 μm, within 150 μm, within 100 μm, within 50 μm, within 40 μm, within 30 μm, within 20 μm, within 10 μm, or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical module, comprising:
   a carrier;
   an electronic component disposed on the carrier;
   a lid disposed on the carrier, the lid defining a first aperture over the electronic component; and
   a diffuser disposed within the first aperture, wherein the diffuser has an inwardly-concave surface facing the electronic component, the inwardly-concave surface of the diffuser has a first region proximal to a geometric center of the diffuser and a second region distal from the geometric center of the diffuser, the first region is separated from the electronic component by a first distance along a direction perpendicular to a light receiving surface of the electronic component, the second region is separated from the electronic component by a second distance along the direction, and the first distance is greater than the second distance.

2. The optical module of claim 1, further comprising a bonding layer disposed between the diffuser and a sidewall of the first aperture.

3. The optical module of claim 2, wherein the bonding layer has body-centered cubic (BCC) crystal structure.

4. The optical module of claim 2, wherein the bonding layer includes metal or metal oxide.

5. The optical module of claim 2, wherein a thickness of the bonding layer is in a range from 100 nanometer (nm) to 200 nm.

6. The optical module of claim 2, wherein the bonding layer is in contact with the diffuser and the sidewall of the first aperture.

7. The optical module of claim 1, wherein a thickness of the diffuser is less than or equal to a depth of the first aperture.

8. The optical module of claim 1, wherein the first aperture has a first opening tapered from the lid toward the carrier and a second opening tapered from the carrier toward the lid, and wherein the first opening is connected to the second opening.

9. The optical module of claim 1, wherein the lid further has a first cavity to accommodate the electronic component, the lid further defines a second aperture between the first aperture and the first cavity, and a width of the first aperture is less than a width of the second aperture.

10. The optical module of claim 1, wherein the inwardly-concave surface faces the carrier.

11. The optical module of claim 9, wherein the first aperture and the second aperture define a ladder-like structure, and the diffuser is conformal to a shape of the ladder-like structure.

12. The optical module of claim 1, wherein the diffuser has an upper surface opposite to the inwardly-concave surface, the inwardly-concave surface has a central region and a peripheral region around the central region, and a distance between the upper surface and the central region of the inwardly-concave surface is less than a distance between the upper surface and the peripheral region of the inwardly-concave surface.

13. The optical module of claim 1, wherein a thickness of a portion of the diffuser adjacent to a sidewall of the first aperture is substantially equal to a depth of the first aperture.

14. An optical module, comprising:
    a carrier;
    an electronic component disposed on the carrier;
    a lid disposed on the carrier, the lid defining a first aperture over the electronic component; and
    a diffuser disposed within the first aperture, wherein the diffuser has an inwardly- concave surface facing the electronic component, the diffuser has an upper surface opposite to the inwardly-concave surface, the inwardly-concave surface has a central region and a peripheral region around the central region, and a distance between the upper surface and the central region of the inwardly-concave surface is less than a distance between the upper surface and the peripheral region of the inwardly-concave surface.

* * * * *